United States Patent [19]
Hashimoto et al.

[11] 4,240,041
[45] Dec. 16, 1980

[54] HIGH-FREQUENCY AMPLIFIER CIRCUIT

[75] Inventors: Masaru Hashimoto, Ayase; Motoaki Yoshinaga, Yokohama, both of Japan

[73] Assignee: Tokyo Shibaura Denki Kabushiki Kaisha, Japan

[21] Appl. No.: 45,842

[22] Filed: Jun. 5, 1979

[30] Foreign Application Priority Data

Jun. 10, 1978 [JP] Japan .................................. 53/70128

[51] Int. Cl.³ .......................... H03F 3/04; H03F 3/34
[52] U.S. Cl. .................................... 330/288; 330/296; 330/310
[58] Field of Search ............... 330/288, 289, 310, 311; 307/230

[56] References Cited
U.S. PATENT DOCUMENTS

| 3,573,645 | 4/1971 | Wheatley, Jr. | 330/288 |
| 3,935,478 | 7/1974 | Okada et al. | 330/297 |
| 4,119,869 | 10/1978 | Hashimoto | 330/297 |

Primary Examiner—Alfred E. Smith
Assistant Examiner—T. N. Grigsby
Attorney, Agent, or Firm—Finnegan, Henderson, Farabow, Garrett & Dunner

[57] ABSTRACT

Disclosed is a high-frequency amplifier circuit which comprises a first transistor with its base coupled to a high-frequency input terminal and grounded through a first diode and emitter grounded, a second transistor with its emitter coupled to the collector of the first transistor, base grounded through second and third diodes and coupled to a reference power supply terminal through a resistor, and collector directly coupled to the reference power supply terminal, and a third transistor with its base coupled to the emitter of the second transistor, emitter grounded, and collector coupled to an output terminal.

6 Claims, 7 Drawing Figures

HIGH-FREQUENCY AMPLIFIER CIRCUIT

BACKGROUND OF THE INVENTION

This invention relates to a high-frequency amplifier circuit.

In general, few semiconductor integrated circuits are so designed as to produce high outputs of about 10 to 100 mW by amplifying high-frequency input signals ranging from several megahertz to scores of megahertz. In order to produce such high outputs, it is advisable not to apply the Class A amplification with low power efficiency but to use the Class AB, B or C amplification. However, a relatively heavy bias current is necessary to operate the conventional semiconductor integrated circuit in the Class AB, B or C amplification mode, requiring increased power consumption.

SUMMARY OF THE INVENTION

The object of this invention is to provide a high-frequency amplifier circuit capable of producing high output signals by amplifying input signals in the Class AB, B or C amplification mode.

According to an embodiment of this invention, there is provided a high-frequency amplifier circuit comprising input and output terminals, first and second power supply terminals, a first PN junction device coupled between the input terminal and the first power supply terminal, a current source means, a series circuit of second and third PN junction devices coupled between the current source means and the first power supply terminal, a first transistor with its base coupled to the input terminal and emitter coupled to the first power supply terminal, a second transistor with its emitter coupled to the collector of the first transistor, base coupled to the junction between the current source means and the series circuit of the second and third PN junction devices, and collector coupled to the second power supply terminal, and a third transistor with its base coupled to the emitter of the second transistor, emitter coupled to the first power supply terminal, and collector coupled to the output terminal.

DETAILED DESCRIPTION OF THE PREFERRED EMBODIMENTS

Now there will be described high-frequency amplifier circuits according to embodiments of this invention with reference to the accompanying drawings.

Figure 1:
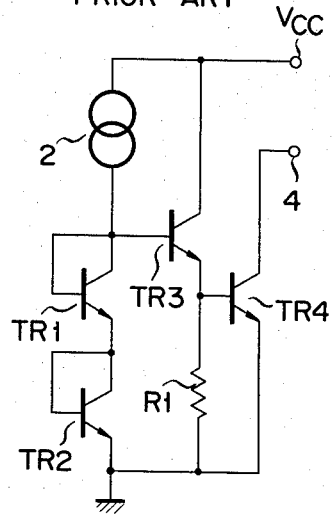
FIG. 1 is a circuit diagram of a prior art constant-current circuit for illustrating the operating principle of a high-frequency amplifier circuit according to an embodiment of this invention.

Referring first to a constant-current circuit as shown in FIG. 1 which is disclosed in, for example, U.S. Pat. No. 4,119,869, there will be described the operating principle of a high-frequency amplifier circuit according to an embodiment of the invention. The constant-current circuit of FIG. 1 comprises a current source 2 with one terminal coupled to a power supply terminal $V_{CC}$, an npn transistor TR1 with its base and emitter coupled to the other terminal of the current source 2, an npn transistor TR 2 with its base and collector coupled to the emitter of the transistor TR1 and emitter grounded, and an npn transistor TR3 with its base coupled to the collector of the transistor TR1, collector coupled to the power supply terminal $V_{CC}$ and emitter grounded through a resistor R1. The transistor TR3 and the resistor R1 form an emitter follower amplifying circuit. The emitter of the transistor TR3 is coupled to the base of an npn output transistor TR4 with its emitter grounded and collector coupled to an output terminal 4.

Assume now that the emitter areas of the transistors TR1 to TR4 are equal, for the simplicity of description. In this case, the base-to-emitter voltage $V_{BE}$ of the transistor may be given as follows:

$$V_{BE} = \frac{kT}{q} \cdot \ln \frac{Ic}{Is}.$$

Here Ic is the collector current of a corresponding transistor, Is is the saturation current of the transistor, k is the Boltzmann's constant, T is the absolute temperature, and q is the electric charge of an electron. Where the transistors TR1 to TR4 are formed on one and the same semiconductor chip, the saturation currents is of the transistors TR1 to TR4 may be regarded as equal, so that the base-to-emitter voltage $V_{BE2}$ of the transistor TR4 may be given by $$V_{BE2} = \frac{kT}{q} (2\ln \frac{I1}{Is} - \ln \frac{I2}{Is}) = \frac{kT}{q} \cdot \ln \frac{I1^2}{Is \cdot I2}, \quad (1)$$

$$V_{BE2} = \frac{kT}{q} \cdot \ln \frac{I3}{Is}.$$

Here I1 is the bias current flowing through the transistors TR1 and TR2, I2 is the collector current of the transistor TR3, and I3 is the collector current of the transistor TR4 or the output current.

From eqs. (1) and (2), we obtain $$\frac{kT}{q} \cdot \ln \frac{I3}{Is} = \frac{kT}{q} \cdot \ln \frac{I1^2}{Is \cdot I2},$$

and hence $$I3 = \frac{I1^2}{I2}. \quad (3)$$

Accordingly, the output current I3 can be controlled by changing the bias current I1 and/or collector current I2.

Figure 2:
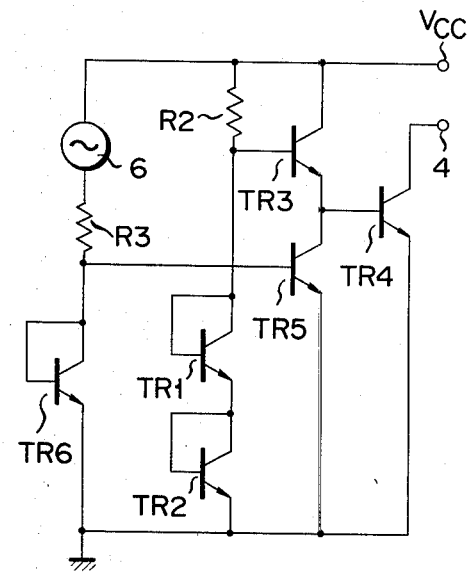
FIG. 2 is a circuit diagram of the high-frequency amplifier circuit according to the embodiment of this invention.

FIG. 2 shows a high-frequency amplifier circuit according to an embodiment of the invention based on the prior art constant-current circuit as shown in FIG. 1. Instead of the resistor R1 in the constant-current circuit of FIG. 1, there is used an npn transistor TR5 with its collector-emitter circuit coupled between the emitter of a transistor TR3 and the ground and serving as a constant-current source. Further, in this amplifier circuit, a resistor R2 used as a current source 2 is coupled between a power supply terminal $V_{CC}$ and the collector of a transistor TR1. A signal source 6 is coupled at one terminal with the power supply terminal $V_{CC}$ and grounded at the other terminal through a resistor R3 and the collector-emitter circuit of an npn transistor TR6 with its base and collector coupled to the base of the transistor TR5. Since the amplifier circuit of FIG. 2 may be integrated on one semiconductor chip, the transconductances of the transistors TR1, TR2 and TR6 exhibit nonlinearity corresponding to the transconductances of the transistors TR3 to TR5.

Referring to FIG. 2, if the transconductances of the transistors TR1 to TR6 are all made equal, the collector current of the transistor TR4 or the output current I3 may be given, from eq. (3), by $$I3 = \frac{I1^2}{I2} = \frac{I1^2}{I0}. \tag{4}$$

Here I0 is the current flowing through the resistor R3 and the transistor TR6 where the base current of the transistor TR5 is ignored. If the current I0 flowing through the transistor TR6 and the current I1 flowing through the transistors TR1 and TR2 are equally set at a current value I in such a situation that no signal is delivered from the signal source 6, an output current I30 for an initial state may be given from eq. (4) as follows:

$$I30 = \frac{I1^2}{I0} = I. \tag{5}$$

Figure 3:
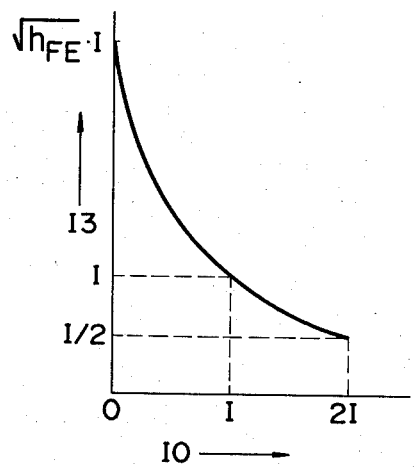
FIG. 3 shows an input-output current characteristic curve of the amplifier circuit of FIG. 2.

If a signal is produced from the signal source 6, under such condition, to change the current I0 flowing through the transistor TR6 from 0 to 2I, the output current I3 varies with the change of the bias current I0 as shown in FIG. 3. When the bias current I0 becomes equal to 2I, for example, the output current becomes I/2. Where the bias current I0 is zero, on the other hand, the output current I3 is to become infinitely great as seen from eq. (4) if a current amplification factor $h_{FE}$ of the transistor TR4 is infinite, though, actually, it will be given, from eq. (4), by $$I3 \cdot \frac{I3}{h_{FE}} = I^2$$

or $$I3 = \sqrt{h_{FE} \cdot I} \tag{6}$$

since a current flows through the transistor TR3 owing to the base current of the transistor TR4.

If the current amplification factor $h_{FE}$ of the transistor TR4 is, for example, 100, the output current I3 will vary from I/2 to 10I, so that the transistor TR4 will operate in the class AB amplification mode. Further, in order to set the maximum value of the output current I3, there may be provided a resistor or some other element between the emitter of the transistor TR3 and the ground.

Figure 4:
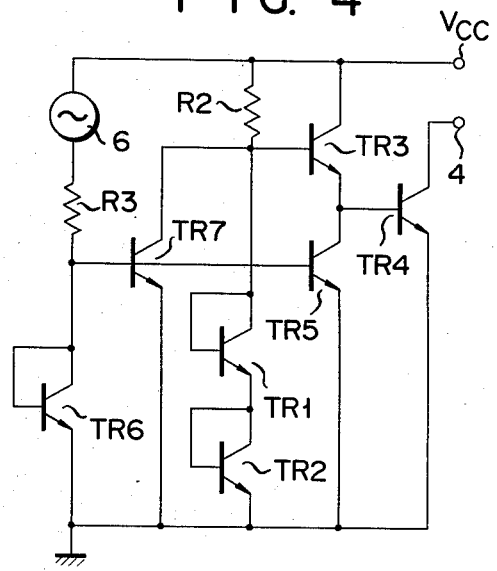
FIG. 4 is a circuit diagram of a high-frequency amplifier circuit according to another embodiment of this invention.

FIG. 4 shows a high-frequency amplifier circuit according to another embodiment of this invention. The circuit of FIG. 4 is the same as the circuit of FIG. 2 except that it additionally includes an npn transistor TR7 with its emitter grounded, base coupled to the collector of a transistor TR6 and collector connected to a power supply terminal $V_{CC}$ through a resistor R2.

Suppose that the high-frequency amplifier circuit as shown in FIG. 4 is so constructed that the relationship between the bias current I0, the current I1 flowing through transistors TR1 and TR2, and a current I4 flowing through the resistor R2 may be given by the following equation when no signal is delivered from a signal source 6.

$$I0 = I1 = \frac{I4}{2} = I. \tag{7}$$

Within a range of linear operation, the following equation is obtained:

$$I1 = I4 - I5 \tag{8}$$

where I5 is the current flowing through the collector-emitter path of the transistor TR7.

Like the case of the embodiment of FIG. 2, on the other hand, the output current I3 may be given by $$I3 = \frac{I1^2}{I0}. \tag{9}$$

Since the transistors TR6 and TR7 form a current mirror, the bias current I0 is equal to the current I5 flowing through the transistor TR7.

Let it be supposed that in this high-frequency amplifier circuit the current I0 flowing through the transistor TR6 varies from 0 to 2I. Where I0=2I, I5 becomes 2I, so that the following equation is obtained from eq. (8), $$I1 = I4 - I5 = 2I - 2I = 0.$$

Accordingly, from eq. (9), the current I3 becomes zero.

Where the current I0 is zero, the output current I3 is infinite as seen from eq. (4) because the current I5 flowing through the collector-emitter path of the transistor TR7 is zero, though, actually, it is given by $$I3 = \sqrt{h_{FE} \cdot 2I} \tag{10}$$

since a base current flows through the base of a transistor TR4, like the case of the aforementioned embodiment.

Figure 5:
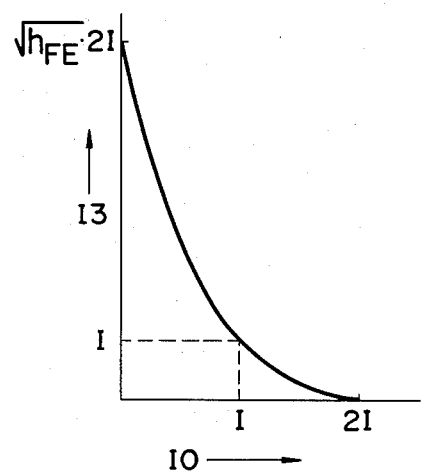
FIGS. 5 and 6 show input-output current characteristic curves of the amplifier circuit of FIG. 4 where the circuit is set to varied initial states.

If the initial condition is so set as stated above, the transistor TR4 of the amplifier circuit of FIG. 4 operates in the Class AB amplification mode as shown in FIG. 5, providing a greater gain as compared with the case of the embodiment of FIG. 2.

Subsequently, assume that the high-frequency amplifier circuit of FIG. 4 is so designed that the current I0 flowing through the transistor TR6, current I4 flowing through the resistor R2 and the current I5 flowing through the transistor TR7 are equally set at the current value I.

Since the current I1 flowing through the transistors TR1 and TR2 is zero in the initial state, the output current I3 also becomes zero, as may be seen from eq. (4). If the current I0 is so changed as to be greater than the current I, the current I5 increases with the current I0, so that the current I1 remains zero. Accordingly, the output current I3 also remains zero. The output current I3 increases as the current I0 becomes smaller than the current I. When the current I0 is reduced to zero, the output current I3, like the case of the aforementioned embodiment, is given as follows:

$$I3 = \sqrt{h_{FE}} \cdot I. \quad (11)$$

Figure 6:
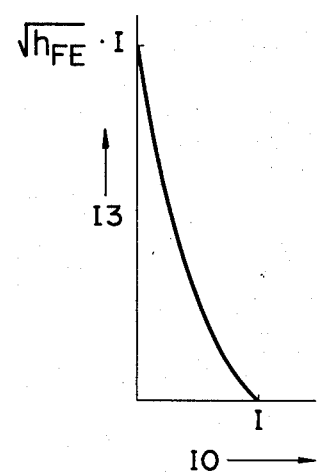

In the amplifier circuit of FIG. 4, if the initial state is set in the aforesaid manner, the transistor TR4 will operate in the Class B amplification mode, as shown in FIG. 6.

Furthermore, suppose a case where the high-frequency amplifier circuit as shown in FIG. 4 is so designed that the saturation current Is flows through the transistor TR7 and the resistor R2 and a current greater than the current Is flows through the transistor TR6 where the amplitude of the output signal from the signal source 6 is zero.

In this case, the output current I3 increases as the current I0 becomes smaller than the current Is. When the current I0 is reduced to zero, the output current I3 is given by $$I3 = \sqrt{h_{FE}} \cdot I. \quad (12)$$

Accordingly, in this case, the transistor TR4 of the high-frequency amplifier circuit of FIG. 4 operates in the Class C amplification mode.

Figure 7:
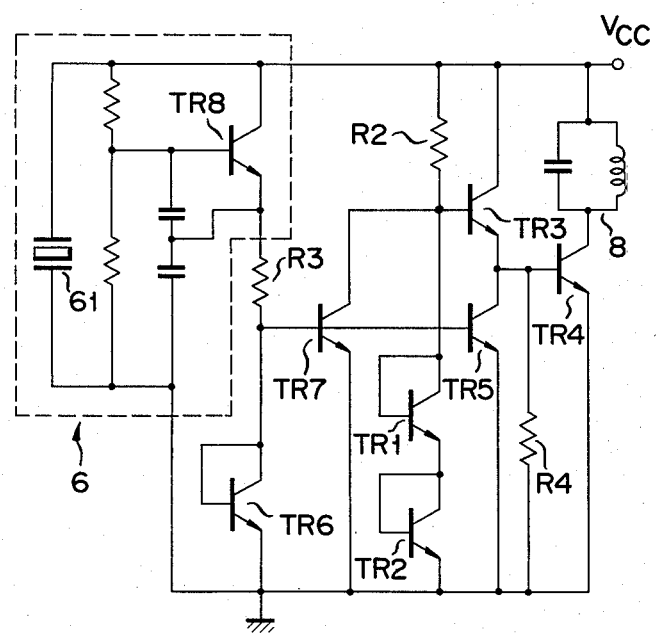
FIG. 7 is a detailed circuit diagram of the amplifier circuit of FIG. 4.

FIG. 7 is a detailed circuit diagram of the high-frequency amplifier circuit shown in FIG. 4. In FIG. 7, the signal source 6 is formed of a quartz oscillator 61 and a Colpitts oscillator circuit including an npn transistor TR8, a resistor R4 is coupled between the base of the transistor TR4 and the ground to suppress the maximum output current, and a tank circuit 8 formed of a coil and a capacitor is coupled as a load between the collector of the transistor TR4 and the power supply terminal $V_{CC}$.

As mentioned before, the transistor TR4 may be operated in the Class AB, B or C amplification mode by suitably setting the parameters of the circuit elements of the amplifier circuit.

Although illustrative embodiments of this invention have been described herein, it is not intended that the invention be limited to those precise embodiments. In the amplifier circuits as shown in FIGS. 2 and 4, for example, pnp transistors may be used in place of the npn transistors.

What we claim is:

1. A high-frequency amplifier circuit comprising:
   input and output terminals,
   first and second power supply terminals,
   a first PN junction device coupled between said input terminal and said first power supply terminal,
   current source means,
   a series circuit of a plurality of PN junction devices coupled between said current source means and said first power supply terminal,
   a first transistor with its base coupled to said input terminal and emitter coupled to said first power supply terminal,
   a second transistor with its emitter coupled to the collector of said first transistor, base coupled to the junction between said current source means and said series circuit of the PN junction devices, and collector coupled to said second power supply terminal, and
   a third transistor with its base coupled to the emitter of said second transistor, emitter coupled to said first power supply terminal, and collector coupled to said output terminal.

2. A high-frequency amplifier circuit according to claim 1, wherein said first to third transistors are formed of npn transistors, and said first to third PN junction devices are formed of npn transistors with their respective bases and collectors coupled with one another.

3. A high-frequency amplifier circuit according to claim 1 further comprising a fourth transistor with its base coupled to said input terminal, collector coupled to the junction between said current source means and said series circuit of the PN junction devices, and emitter coupled to said first power supply terminal.

4. A high-frequency amplifier circuit according to claim 3, wherein said first to fourth transistors are formed of npn transistors, and said first to third PN junction devices are formed of npn transistors with their respective bases and collectors coupled with one another.

5. A high-frequency amplifier circuit according to claim 1 or 3, wherein said current source means is a resistor.

6. A high-frequency amplifier circuit comprising:
   input and output terminals,
   first and second power supply terminals,
   a first PN junction device coupled between said input terminal and said first power supply terminal,
   current source means,
   a series circuit of a plurality of PN junction devices coupled between said current source means and said first power supply terminal,
   a first transistor with its base coupled to the junction between said current source means and said series circuit of the PN junction devices, and collector coupled to said second power supply terminal,
   a second transistor with its base coupled to the emitter of said first transistor, emitter coupled to said first power supply terminal, and collector coupled to said output terminal, and
   control means coupled between the base of said second transistor and said first power supply terminal, whereby the base potential of said second transistor is controlled in response to an input signal supplied to said input terminal.

* * * * *